United States Patent [19]

Perry

[11] Patent Number: 4,862,929
[45] Date of Patent: Sep. 5, 1989

[54] SINGLE CAMEL HUMP DIE

[75] Inventor: James R. Perry, Hennepin, Minn.

[73] Assignee: Honeywell Inc., Minneapolis, Minn.

[21] Appl. No.: 161,577

[22] Filed: Feb. 29, 1988

[51] Int. Cl.$^4$ .......................... B21F 1/00; B21F 11/00
[52] U.S. Cl. ..................................... 140/105; 29/566.3
[58] Field of Search .......................... 140/1, 105, 106;
29/564.1, 564.7, 566.1, 566.3, 566.4, 837, 839, 874, 882

[56] References Cited

U.S. PATENT DOCUMENTS

| 2,835,282 | 5/1958 | Schmuldt | 170/105 |
| 3,004,262 | 10/1961 | Cubbridge et al. | 29/566.3 |
| 3,769,823 | 11/1973 | Greeninger | 29/566.3 |
| 3,796,201 | 3/1974 | Golub | 140/105 |
| 3,903,934 | 9/1975 | Vizy | 140/105 |
| 4,103,718 | 8/1978 | Steigerwald | 140/105 |

FOREIGN PATENT DOCUMENTS

| 522880 | 8/1976 | U.S.S.R. | 140/105 |
| 761081 | 9/1980 | U.S.S.R. | 140/105 |

Primary Examiner—Robert L. Spruill
Attorney, Agent, or Firm—Haugen and Nikolai

[57] ABSTRACT

A single camel hump die is disclosed wherein the die comprises an upper and lower compound each including a spring engaging piece, a spring, and a component restraining piece. The die further comprises a pair of wire bending pieces to shape lead wires into a predetermined shape.

1 Claim, 4 Drawing Sheets

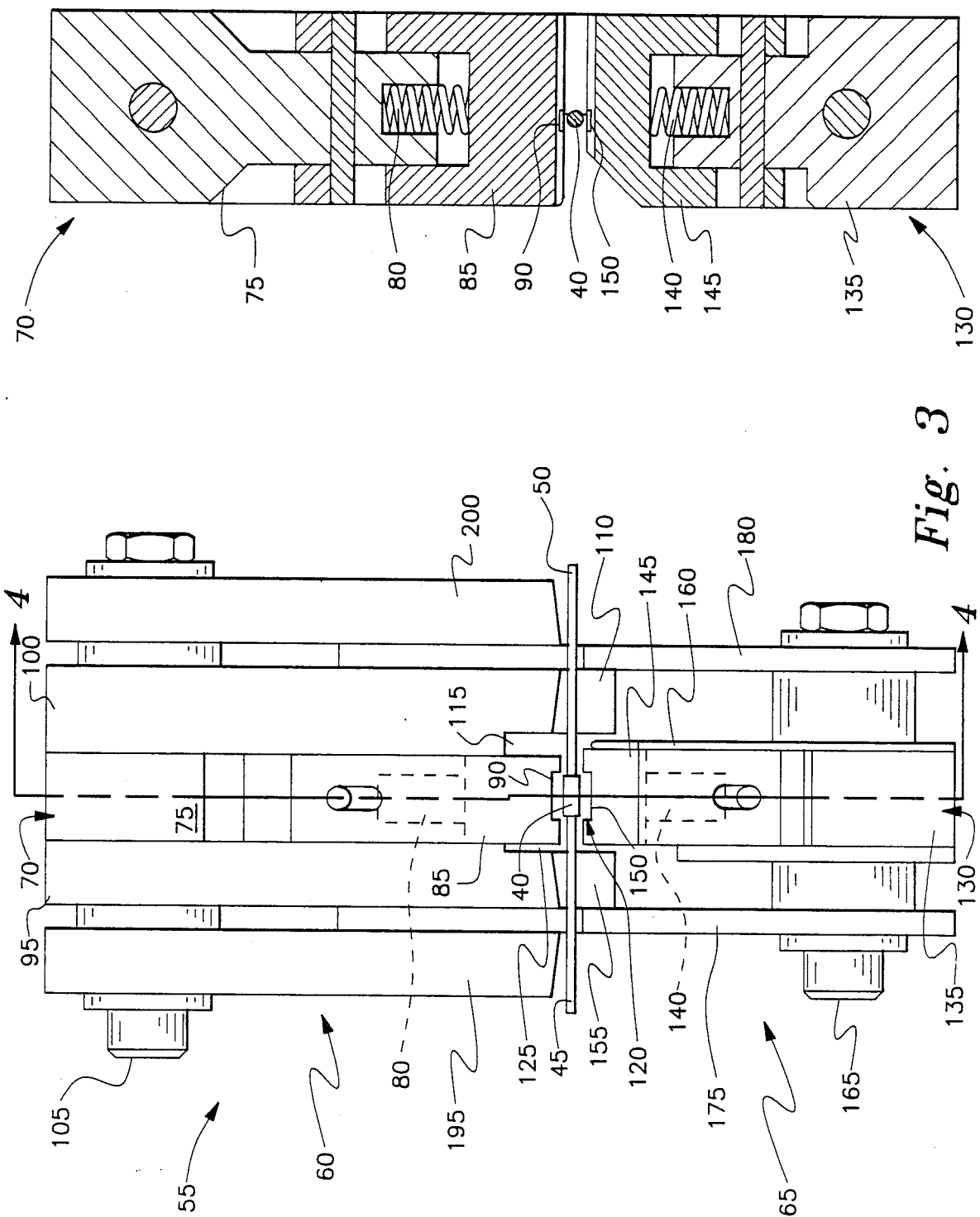

SINGLE CAMEL HUMP DIE

BACKGROUND OF THE INVENTION

This invention relates generally to dies and, more particularly, to dies for use in forming lead wires of electrical components into a predetermined shape. Referring to FIG. 1 a double camel hump component is shown. This component must meet government Weapon Specification 6536 Revision E which requires that the minimum inside bend radius R of any bend on the formed lead shall be 1 lead diameter. Weapon Specification 6536 Rev. E (WS 6536 Rev. E) also requires that the component span width W be short enough to allow mounting of components on printed wiring boards without bending the leads inwardly from the shoulders, i.e. the components must be mounted parallel to the board and the leads must form a right angle with the board surface. A typical width W is, for example, 0.350 inches.

The current standard double camel hump component made using a Mark V lead forming machine manufactured by Technical Devices Co. does not meet the component span width required by WS 6536 Rev. E. It is known that a single camel hump component will decrease the component span width W. Prior art dies are not capable of making a single camel hump component which meets government specifications due to the unequal forces applied to the lead wires and the component. These unequal forces result in an unacceptably high percentage of deformed and/or damaged parts.

Referring to FIG. 2 a prior art die is shown. Component piece 5 having lead wires 10 restrained by clamping fingers 15 has lead wires 10 bent using right wire bending piece 20 and left wire bending piece 25. Form plates 30 and 35 act to bend lead wires 10 into the two camel humps. The forces applied to lead wires 10 in FIG. 2 are equal due to the simultaneous bending action of the wire bending pieces 20 and 25. If one of the wire camel hump form plates is removed to produce a single camel hump component it is readily apparent that unequal forces will be applied to the component causing stress which results in deformed and/or damaged components. It is an advantage of the present invention that components may be formed in a single camel hump configuration without damaging or deforming the components. Total encapsulation of the component and lead wires while forming the leads results in equal restraining forces on both sides of the component. Therefore, all stresses are external to what is encapsulated which results in correctly formed lead wires for unstressed components which meet the requirements of WS 6536 Rev. E. Other advantages include formation of a component with a span width short enough to allow mounting of components on printed wiring boards without bending the leads inwardly from the lead shoulders and a minimum inside bend radius of one lead diameter. Further, the die can be used with loose components or tape and reel components and the die will work in already existing equipment.

As those skilled in the art know, prior art dies such as that shown in FIG. 2 which utilize clamping fingers 15 introduce further possible error because the operator could put too much pressure on the clamping fingers causing excess force on the leads which in turn causes distortion. This problem is eliminated by the total encapsulation of the part in the present invention.

SUMMARY OF THE INVENTION

A single camel hump die is disclosed. The die comprises an upper and lower compound each including a spring engaging piece, a spring, and a component restraining piece. The die further comprises a pair of wire bending pieces.

OBJECTS OF THE INVENTION

It is the principle object of the invention to provide a die suitable for forming lead wires of electrical components into a predetermined shape which meets WS 6536 Rev. E. These and other objects and advantages of the invention will become apparent from the following detailed description of the preferred embodiment.

BRIEF DESCRIPTION OF THE DRAWINGS

For a more complete understanding of the invention, reference is hereby made to the drawings in which:

FIG. 3 shows a front view of the preferred embodiment in an open position.

FIG. 4 shows a cross-sectional view on lines 4—4 of FIG. 3 of the preferred embodiment in an open position.

DETAILED DESCRIPTION OF THE PREFERRED EMBODIMENTS

Figure 1:
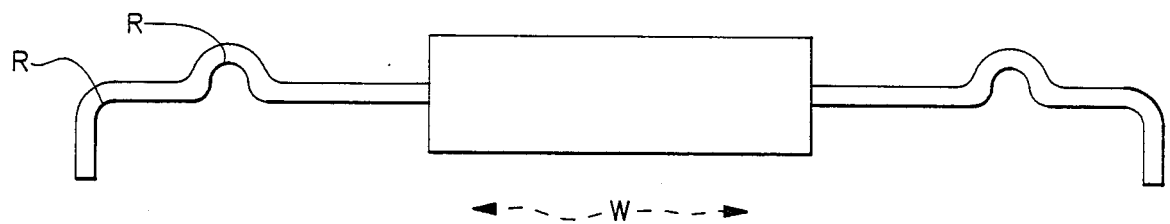
FIG. 1 shows a double camel hump component.
Figure 2:
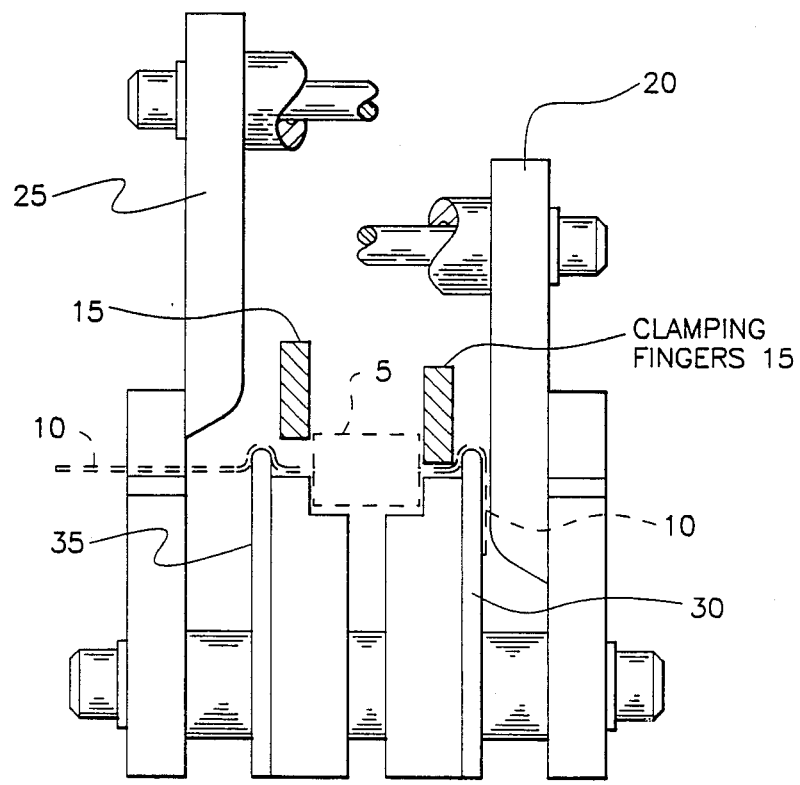
FIG. 2 shows a prior art die used to form double camel hump components.

Referring to FIGS. 3 and 4, a single camel hump die is shown. The die in FIGS. 3 and 4 solves the problems of the prior art dies by totally encapsulating the component 40 and lead wires 45 and 50, thus eliminating undue stress to the component and lead wires.

Die 55 consists of two pieces, an upper compound 60 and a lower compound 65. Upper compound 60 consists of an upper encapsulating piece 70 which itself includes a spring engaging piece 75 and a spring 80 attached to piece 75. A component restraining piece 85 is connected to the lower portion of the spring 80. The bottom of piece 85 has a cut-out 90 machined out of the piece which is designed to encapsulate one half of a component. A pair of lead wire bending pieces 95 and 100 ar attached to either side of the upper encapsulating piece 70 by means of screw 105. The lower portion of the right wire bending piece 100, 110, has a lesser width than the upper portion of the right wire bending piece 100 such that slot 115 is formed by the right wire bending piece 100 and the component restraining piece 85. Slot 115 is of a predetermined width to allow for formation of a single camel hump of bend radius R. The lower portion of the left wire bending piece 95, 155 also has a lesser width such that slot 125 is formed. Slot 125 has a lesser width than slot 115 since no camel hump is formed on the left side of lead wire 50.

Figure 7:
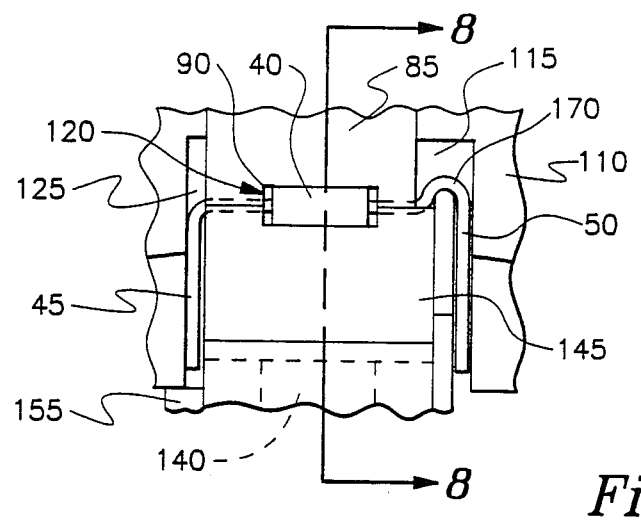
FIG. 7 shows an enlarged partial front view of the component nest area.

The lower compound 65 consists of a lower encapsulating piece 130 which is symmetrically arranged like the upper encapsulating piece 70. Piece 130 includes a spring engaging piece 135, a spring 140 attached to piece 135 and a component restraining piece 145 is connected to the upper portion of the spring 140. The top of the component retraining piece 145 has a cut-out 150 machined out of the piece which is designed to encapsulate one half of a component. The two component restraining pieces 145 and 85 form a component nest 120 with cut-outs 90 and 150 which is shown in an enlarged view in FIG. 7. Form plate 160 is attached to the lower encapsulating piece 130 by screw means 165 and is designed to be slideably received by slot 115 and thereby forms the camel hump 170 in lead wire 50 as shown in FIG. 7. A pair of inner cutter plates 175 and 180 ar attached to the lower compound by screw means 165 and constructed to slideably engage the upper compound 60, i.e. the outsides of the two wire bending preces 95 and 100. A pair of outer cutter plates 195 and 200 are attached to the upper compound 60 by screw means 105 and are constructed to slideably engage the lower compound 65, i.e., the outsides of the pair of inner cutting plates 75 and 180. As the inner and outer plates engage, the lead wires 45 and 50 are trimmed to a predetermined length.

Figure 6:
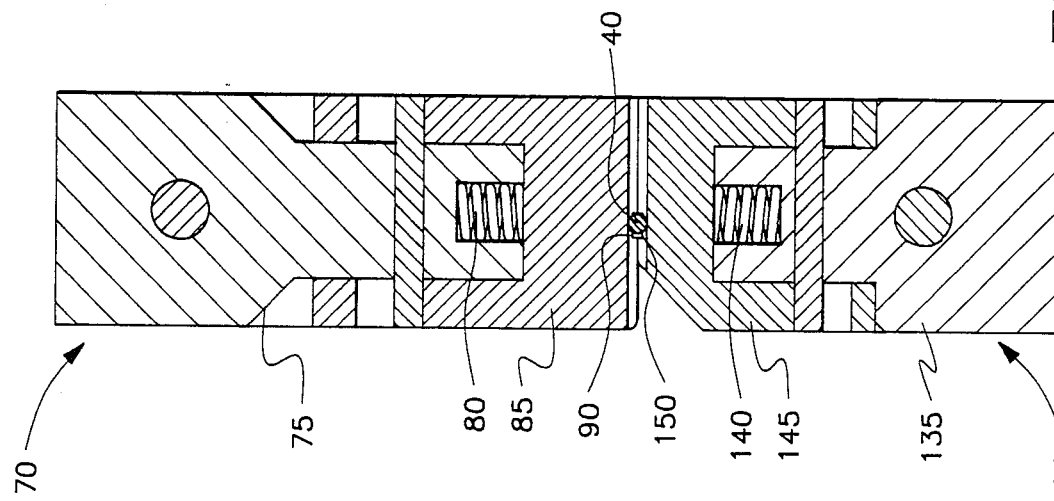
FIG. 6 shows a cross-sectional view on lines 6—6 of FIG. 5 of the preferred embodiment in a closed position.
Figure 5:
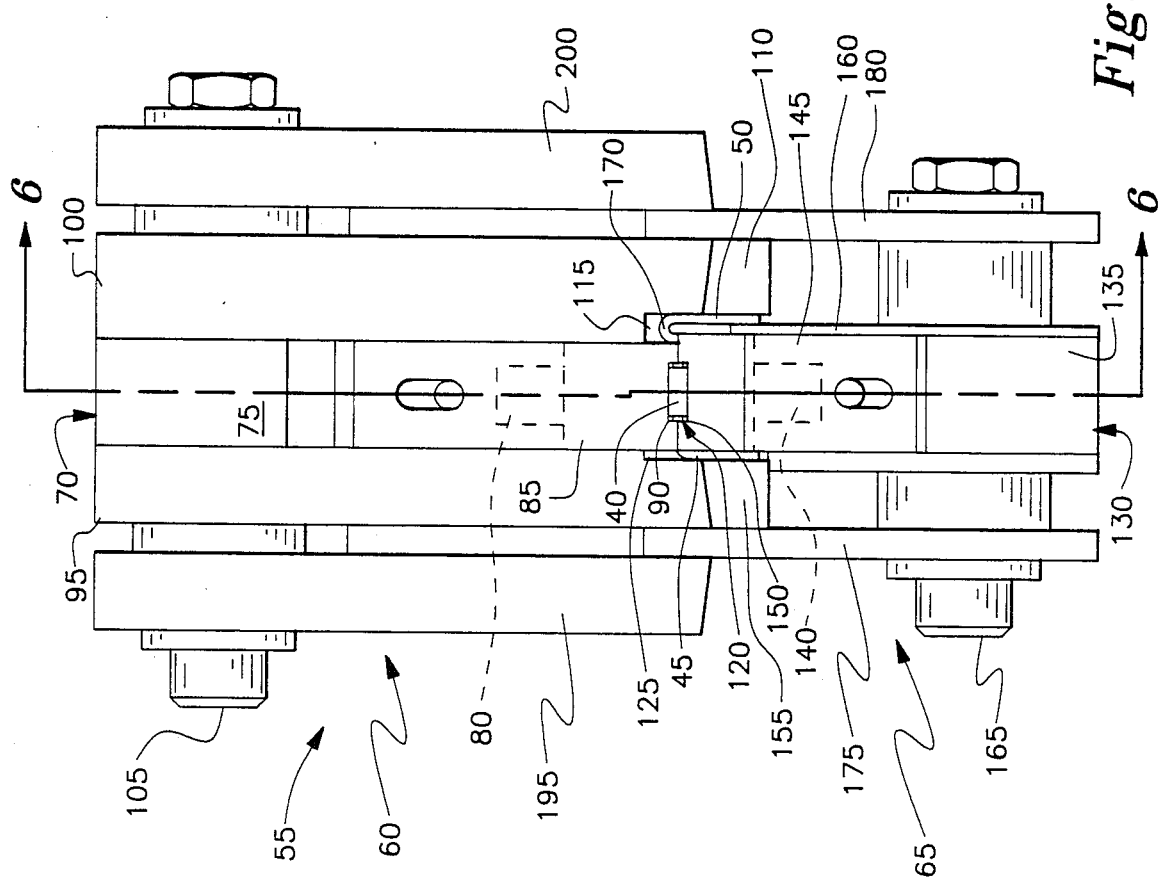
FIG. 5 shows a front view of the preferred embodiment in a closed position.
Figure 8:
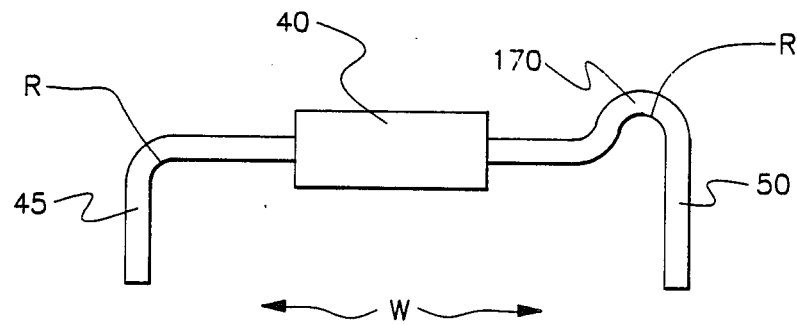
FIG. 8 shows a single camel hump component.

In use, the upper and lower compounds, 60 and 65 are naturally separated as shown in FIGS. 3 and 4. A component piece 40 is placed into the component nest 120. Referring now to FIGS. 5 and 6, as the upper and lower compounds 60 and 65 engage, the inner and outer cutting plates trim the lead wires 45 and 50 to their predetermined length and the wire bending pieces 95 and 100 bend the wire into the predetermined 90 degree bend radius R while form plate 160 simultaneously engages lead wire 50 to form camel hump 170. A single camel hump component is shown in FIG. 8. A component span width W of 0.350 inches is shown in the preferred embodiment, but it should be understood that any component span width may be used.

While there has been shown and described a preferred embodiment of the invention, those skilled in the art will appreciate that various changes and modifications may be made to the illustrated embodiment without departing from the true spirit and scope of the invention which is to be determined from the appended claims.

It will be understood that modifications and variations may be effected without departing from the scope of the novel concepts of this invention.

The embodiments of the invention in which an exclusive property or right is claimed are defined as follows:

1. A two part die for bending lead wires of a component having right and left lead wires into a predetermined form wherein only one of the lead wires is formed into a single camel hump comprising:
   (a) an upper and lower compound constructed and arranged to slideably engage wherein the upper compound comprises an upper encapsulating piece which includes a spring engaging piece having a top and a bottom, a spring having upper and lower ends attached at one end to the bottom of the spring engaging piece, and a component restraining piece having a top and a bottom, the top being attached to the lower end of the spring wherein the bottom of the component restraining piece has a cut-out portion constructed and arranged to encapsulate the upper half of a component;
   (b) a pair of wire bending pieces, right and left, adjacent to each side of the upper encapsulating piece constructed and arranged such that they terminate short of the bottom of the component restraining piece when the upper encapsulating piece is in an uncompressed state and attached to the upper encapsulating piece by a screw means;
   (c) the lower compound comprises a lower encapsulating piece which includes a spring engaging piece having a top and a bottom, a spring having upper and lower ends, the lower end being attached to the top of the spring engaging piece, and a component restraining piece having a top and a bottom, the bottom being attached to the upper end of the spring, the top of the component restraining piece has a cut-out portion constructed and arranged to encapsulate the lower half of a component so that, as the upper and lower compounds are engaged, the component is encapsulated and restrained by the upper and lower component restraining pieces, so as to bend the lead wires wherein the right wire bending piece is constructed and arranged such that a lower portion of said piece has a width less than an upper portion, whereby a slot of predetermined width is formed between the right wire bending piece and the upper encapsulating piece; and
   (d) wherein the left wire bending piece is constructed and arranged such that a lower portion of said piece has a width less than an upper portion, whereby a slot of predetermined width is formed between the left wire bending piece and the upper encapsulating piece; and
   (e) wherein the right lead wire has a camel hump formed by means of a form plate attached to the right side of the lower spring engaging piece, wherein said form plate is constructed and arranged to be slideably engaged by the right slot; and
   (f) a right and left wire cutting means, wherein the cutting means includes a pair of inner cutter plates attached to both sides of the lower encapsulating piece and constructed and arranged to slideably engage the outsides of said left and right wire bending pieces, and a pair of outer cutting plates attached to the upper compound by a screw means and constructed arranged to slideably engage the outsides of said inner cutting plates whereby, as the inner and outer cutting plates engage, the lead wire is cut.

* * * * *